(12) United States Patent
Sugimoto

(10) Patent No.: US 7,427,738 B2
(45) Date of Patent: Sep. 23, 2008

(54) LIGHT-RECEIVING AMPLIFIER AND OPTICAL PICKUP DEVICE

(75) Inventor: Kohichiroh Sugimoto, Tenri (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 66 days.

(21) Appl. No.: 11/591,037

(22) Filed: Oct. 31, 2006

(65) Prior Publication Data

US 2007/0096013 A1    May 3, 2007

(30) Foreign Application Priority Data

Oct. 31, 2005  (JP) .............................. 2005-317553

(51) Int. Cl.
*H03F 3/08* (2006.01)
*G11B 7/00* (2006.01)

(52) U.S. Cl. ......................... 250/214 A; 250/214 AG; 369/124.12; 330/308

(58) Field of Classification Search ............. 250/214 A, 250/214 AG; 369/53.2, 53.27, 124.1, 124.11, 369/124.12, 124.15; 330/308
See application file for complete search history.

(56) References Cited

U.S. PATENT DOCUMENTS

| 6,100,764 | A  | * | 8/2000  | Kim ............................ 330/308 |
| 7,133,346 | B2 | * | 11/2006 | Okuda et al. .............. 369/53.27 |
| 2002/0175272 | A1 | * | 11/2002 | Shimizu .................. 250/214 A |
| 2003/0112727 | A1 |   | 6/2003  | Okuda et al. |
| 2004/0164232 | A1 | * | 8/2004  | Nakagawa ............... 250/214 R |

FOREIGN PATENT DOCUMENTS

| JP | 03165609 A | * | 7/1991 |
| JP | 07231307 A | * | 8/1995 |
| JP | 2003-187484 A |  | 7/2003 |
| JP | 2004120311 A | * | 4/2004 |

* cited by examiner

*Primary Examiner*—Stephen Yam
(74) *Attorney, Agent, or Firm*—Morrison & Foerster LLP

(57) ABSTRACT

A light-receiving amplifier circuit of the present invention includes: a first preamplifier circuit to which a light-receiving element is connected; a second preamplifier circuit which is the same type as the first preamplifier circuit and which is apart from the light-receiving element; and a differential amplifier circuit for amplifying output voltage differential between the preamplifier circuits, wherein each of the first preamplifier circuit includes an amplifier and first and second plural feedback resistors, each of which resistors has an end commonly connected to an input terminal of the amplifier; an amplification factor of the differential amplifier circuit is less than one; and the first preamplifier circuit includes an output voltage expanding circuit which is connected to (i) another end of the first feedback resistors in the first preamplifier circuit and (ii) an output terminal of the amplifier, and which circuit is for expanding an output voltage range from the amplifier and supplying the expanded output voltage range to the differential amplifier circuit. This configuration provides a light-receiving circuit which is capable of reducing heat noise to prevent deterioration of the S/N ratio, while avoiding narrowing down of an output voltage range.

16 Claims, 9 Drawing Sheets

LIGHT-RECEIVING AMPLIFIER AND OPTICAL PICKUP DEVICE

This Nonprovisional application claims priority under 35 U.S.C. § 119(a) on Patent Application No. 317553/2005 filed in Japan on Oct. 31, 2005, the entire contents of which are hereby incorporated by reference.

FIELD OF THE INVENTION

The present invention relates to a light-receiving amplifier circuit and an optical pickup device, each for use in a device capable of reading and/or writing into information to/from an optical disc.

BACKGROUND OF THE INVENTION

Optical discs are widely used as a medium for storing therein pieces of data of music, video, documents, or the like, and various devices for reading or writing information from/ to an optical disc are developed. Such devices, in many cases, adopts an optical pickup device (See for example Japanese Unexamined Patent Publication No. 2003-187484 (Tokukai 2003-187484; Published on Jul. 4, 2003)) which device is a main element for inputting/outputting signals, by using its edge portion, to/from an optical disc.

FIG. 8 is a block diagram illustrating a main configuration of a conventional optical pickup device 801. The optical pickup device 801 includes: a semiconductor laser 85 serving as a light source; and a lens optical system 82 arranged in a light path between the semiconductor laser 85 and the optical disc 81, which system includes a prism 84 and a condensing lens 83. This optical pickup device 801 is configured so that laser light having reflected off the optical disc 81 reaches the prism 84 through the lens optical system 82. Then, the light is reflected off the prism 84, and enters a light-receiving amplifier circuit 91 having a light-receiving element (photodiode).

The semiconductor laser 85 outputs laser light, so as to irradiate the optical disc 81 with the laser light via the condensing lens 83. The laser light is then reflected off the optical disc 81, and reaches the prism 84 via the lens optical system 82. The laser light is reflected off the prism 84, and is input to the light-receiving amplifier circuit 91. In the light-receiving amplifier circuit 91, the laser light is subjected to photoelectric conversion, and is output, as electric signals, from the light-receiving amplifier circuit 91.

FIG. 9 is a circuit diagram illustrating an exemplary configuration of an equivalent circuit block of a conventional light-receiving amplifier circuit 91. The light-receiving amplifier circuit 91 includes a preamplifier circuit 92. The preamplifier circuit 92 includes an amplifier A91. To the input terminal of the amplifier A91 connected is one end of the light-receiving element PD whose another end is grounded. Furthermore, feedback resistors RfH91 and RfL91 each for current-voltage conversion are provided so that feedback resistors RfH91 and RfL91 and the amplifier A91 are connected in parallel to one another. One end of each of the feedback resistors RfH91 and RfL91 is commonly connected to the input terminal of the amplifier A91.

The light-receiving amplifier circuit 91 is provided with NPN transistors Q91 and Q92. The respective gates of the NPN transistors Q91 and Q92 are commonly connected to the output terminal of the amplifier A91. The respective collectors of the NPN transistors Q91 and Q92 are connected to a line via which a power source voltage Vcc is supplied. The emitter of the NPN transistor Q91 is connected to one end of a constant current source IcH91 whose another end is grounded. The emitter of the NPN transistor Q92 is connected to one end of a constant current source IcL91 whose another end is grounded.

Another end of the feedback resistor RfH91 is connected to the collector of the NPN transistor Q91, and another end of the feedback resistor RfL91 is connected to the collector of the NPN transistor Q92.

The light-receiving amplifier circuit 91 is further provided with a preamplifier circuit 93 whose configuration is the same as that of the preamplifier circuit 92. This preamplifier circuit 93 includes an amplifier A92 which is apart from the light-receiving element PD.

For the amplifier A92, feedback resistors RfH92 and RfL92 are provided so that feedback resistors RfH92 and RfL92 and the amplifier A91 are connected in parallel to one another. One end of each of the feedback resistors RfH92 and RfL92 is commonly connected to an input terminal of the amplifier A92.

The preamplifier circuit 93 is provided with NPN transistors Q93 and Q94. The respective gates of the NPN transistors Q93 and Q94 are commonly connected to the output terminal of the amplifier A92. The respective collectors of the NPN transistors Q93 and Q94 are connected to a line via which a power source voltage Vcc is supplied. The emitter of the NPN transistor Q93 is connected to one end of a constant current source IcH92 whose another is grounded. The emitter of the NPN transistor Q94 is connected to one end of a constant current source IcL92 whose another end is grounded.

Another end of the feedback resistor RfH92 is connected to the collector of the NPN transistor Q93, and another end of the feedback resistor RfL92 is connected to the collector of the NPN transistor Q94.

The light-receiving amplifier circuit 91 is provided with a differential amplifier circuit 98. The differential amplifier circuit 98 has a differential amplifier A93. One input terminal (Hereinafter, first input terminal) of the differential amplifier A93 is connected to a switch SW 91 via a resistor Rs91. To a connection point between the first input terminal of the differential amplifier A93 and the resistor Rs91 connected via a resistor Rf93 is a terminal through which an external reference voltage is supplied. Another input terminal (hereinafter, second input terminal) of the differential amplifier A93 is connected to a switch 92 via a resistor Rs92. Between the other input terminal of the differential amplifier A93 and the output terminal provided is a feedback resistor 94.

The switch SW91 is for switching the connection of the first input terminal of the differential amplifier A93 to one of (i) a terminal between the NPN transistor Q91 and a feedback resistor RfH91 and (ii) a terminal between the NPN transistor Q92 and a feedback terminal RfL91. A switch SW 92 switches the connection of the second input terminal of the differential amplifier A93 to one of (i) a terminal between the NPN transistor Q93 and the feedback resistor RfH92 and (ii) a terminal between the NPN transistor Q94 and the feedback resistor RfL92.

A laser light signal is converted into an electric-current signal Isc by the light-receiving element PD, and the electric-current signal Isc is subjected to current-voltage conversion and amplification by using the feedback resistor RfH91. Here, an output circuit of the preamplifier 92 illustrated in FIG. 9 is an emitter follower circuit which is configured by the NPN transistor Q91 and a constant current source IcH91.

The signal having been subjected to the current-voltage conversion by the preamplifier 92 is then multiplied by (Rf94/ Rs92) by the differential amplifier circuit 98 in the later stage, and the resulting signal is output as an electric signal Vo. At this point, the constant current source IcL91 of the preamplifier circuit 92 is not operating. Only a loop which is connected to the constant current source IcH91 and which includes the feedback resistor RfH91, NPN transistor Q91, and amplifier A91 is operated. A loop which is connected to the constant current source IcL91, and which includes the feedback resistor RfL91, NPN transistor Q92, and the amplifier A91 is not operated.

This example deals with a case where two sensitivities (gains) are provided. However, it is possible to provide three or more sensitivities (gains) by increasing the number of feedback resistors, transistors, and amplifiers A91 each connected to a constant current source.

When a recording/reproducing-use optical pickup device writes in data, it forms pits on an optical disc by irradiating the optical disc with laser light of 200 mW or more. On the other hand, when the optical pickup device reads out data on an optical disc, the device irradiates an optical disc with less intensive laser light of approximately 20 mW, and reads out data recorded on the optical disc by reading variation in reflection of the laser light off the optical disc. Therefore, the light power for writing in data and the light power for reproducing data differ from each other by approximately a factor of 10. Further, the reflectance of optical discs differs amongst ROM disc, RAM disc, ±R disc, and ±RW disc by approximately a factor of 1 to 8. Accordingly, an amount of laser light incident on the light-receiving amplifier circuit of the optical pickup device largely varies depending on whether data is being written in or being read out, and depending on the type of optical disc being handled.

On this account, in the light-receiving amplifier circuit, plural sensitivities (gains) are switched thereamong in accordance with a variation range of incident light amount, so as to correspond to variation in the amount of laser light being incident. For example, when writing in data, the amount of laser light incident is large, and as such, the sensitivity (gain) of the light-receiving amplifier circuit is switched to a small sensitivity (gain). Meanwhile, when reading out data, the amount of laser light incident is small, and as such, the sensitivity (gain) of the light-receiving amplifier circuit is switched to a large sensitivity (gain).

The sensitivity (gain) of the light-receiving amplifier circuit 91 illustrated in FIG. 9 is determined by multiplying the feedback resistor RfH91 of the preamplifier circuit 92 by (Rf94/Rs92) by the differential amplifier circuit 98 in the later stage. In a case of reading out data from a less reflective optical disc such as RAM disc, the light-receiving amplifier circuit needs to be extremely sensitive. Therefore, the gain resistance (RfH91×Rf94/Rs92) of the light-receiving amplifier circuit 91 is large.

When the resistance values of the resistors RfH91 and Rf94 are large, noise in the light-receiving amplifier circuit 91 itself is also large. This causes an extremely poor S/N ratio of output signals Vo of the light-receiving amplifier circuit 91. The noise in the light-receiving amplifier circuit 91 itself is mostly heat noise which is expressed by the following formula:

$$\{4k(RfH91)T(\Delta f)\}^{1/2} \times Rf94/Rs92.$$

In order to reduce such heat noise of the light-receiving amplifier circuit 91, it is necessary to reduce the resistance of the feedback resistor RfH91 in the preamplifier circuit 92, or to reduce the gain (Rf94/Rs92) of the differential amplifier circuit 98 of the subsequent stage. As is indicated by the above formula, the heat noise is proportional to the square root of the feedback resistor RfH91 of the preamplifier circuit 92. However, the gain (Rf94/Rs92) of the differential amplifier circuit 98 in the subsequent stage multiplies the heat noise by (Rf94/Rs92). Accordingly, it is more effective to reduce the heat noise by reducing the gain (Rf94/Rs92) of the differential amplifier circuit 98.

In the conventional light-receiving amplifier circuit 91, the gain (Rf94/Rs92) of the differential amplifier circuit 98 is set at 1 or more. In such a conventional circuit, however, the reduction of the gain (Rf94/Rs92) of the differential amplifier circuit 98 to less than 1 causes a problem of smaller output voltage range (dynamic range) of the light-receiving amplifier circuit, than a case where the gain is 1 or more.

SUMMARY OF THE INVENTION

The present invention is made in view of the foregoing problem, and it is an object of the present invention to provide a light-receiving amplifier circuit and an optical pickup device each capable of reducing heat noise and preventing deterioration in the S/N ratio, while avoiding narrowing down of the output voltage range (dynamic range).

In order to solve the foregoing problem, a light-receiving amplifier circuit of the present invention includes: a first preamplifier circuit of voltage-parallel-feedback type, to which circuit a light-receiving element is connected; a second preamplifier circuit which is the same type as the first preamplifier circuit and which is apart from the light-receiving element; and a differential amplifier circuit for amplifying output voltage differential between the first and second preamplifier circuits, wherein each of the first and second preamplifier circuits includes an amplifier and plural feedback resistors provided in parallel to the amplifier, each of which resistors has an end commonly connected to an input terminal of the amplifier; an amplification factor of the differential amplifier circuit is less than one; and the first preamplifier circuit includes an output voltage expanding circuit which is (A) connected to (i) another end of at least one of the feedback resistors in the first preamplifier circuit and (ii) an output terminal of the amplifier, and (B) for expanding an output voltage range from the amplifier and supplying the expanded output voltage range to the differential amplifier circuit.

In the configuration, the first preamplifier is provided with the output voltage expanding circuit for supplying the output voltage range from the amplifier to the differential amplifier circuit. This output voltage expanding circuit is connected to (i) the other end of at least one of plural feedback resistors in the first preamplifier and (ii) the output terminal of the amplifier. This configuration allows expansion of output voltage range to be supplied from the amplifier of the first preamplifier to the differential amplifier circuit. Accordingly, setting of the amplification factor of the differential amplifier circuit at less than 1, for the purpose of reducing heat noise in the light-receiving amplifier circuit, does not cause narrowing down of the output voltage range of the differential amplifier circuit. Thus, it is possible to reduce the heat noise to prevent deterioration of the S/N ratio, while avoiding narrowing down of the output voltage range of the light-receiving amplifier.

Further, another light-receiving amplifier circuit of the present invention includes: a pre-differential amplifier circuit of voltage-parallel-feedback type, to which circuit a light-receiving element is connected; a differential amplifier circuit for amplifying differential between an output voltage from the pre-differential amplifier circuit and a first reference voltage, wherein: the pre-differential amplifier circuit includes a differential amplifier and plural feedback resistors provided in parallel to the differential amplifier, each of which resistors has an end connected to one of input terminals of the differential amplifier; an amplification factor of the differential amplifier circuit is less than 1; and the differential amplifier circuit includes an output voltage expanding circuit for (i) expanding an output voltage range from the differential amplifier and (ii) supplying the expanded output voltage range to the differential amplifier circuit, the output voltage expanding circuit being connected to another end of at least one of the plural feedback resistors and an output terminal of the differential amplifier.

The above configuration is provided with the output voltage expanding circuit for expanding the output voltage range from the differential amplifier and for supplying the expanded output voltage range to the differential amplifier circuit. This output voltage expanding circuit is connected to the other end of at least one of the plural feedback resistors and the output terminal of the differential amplifier. This configuration allows expansion of output voltage range to be supplied from the differential amplifier of the pre-differential amplifier to the differential amplifier circuit. Accordingly, setting of the amplification factor of the differential amplifier circuit at less than 1, for the purpose of reducing heat noise in the light-receiving amplifier circuit, does not cause narrowing down of the output voltage range of the differential amplifier circuit. Thus, it is possible to reduce the heat noise to prevent deterioration of the S/N ratio, while avoiding narrowing down of the output voltage range of the light-receiving amplifier.

Further, an optical pickup device of the present invention includes: a semiconductor laser element for emitting laser light; and the light-receiving amplifier circuit as set forth in claim 1, for performing photoelectric conversion and amplification with respect to laser light emitted from the semiconductor laser element, which light has been reflected off an optical disc.

In the above configuration, the light-receiving amplifier circuit is provided with the output voltage expanding circuit for expanding the output voltage range from the differential amplifier and for supplying the expanded output voltage range to the differential amplifier circuit. This output voltage expanding circuit is connected to the other end of at least one of the plural feedback resistors and the output terminal of the differential amplifier. This configuration allows expansion of output voltage range to be supplied from the differential amplifier of the pre-differential amplifier to the differential amplifier circuit. Accordingly, setting of the amplification factor of the differential amplifier circuit at less than 1, for the purpose of reducing heat noise in the light-receiving amplifier circuit, does not cause narrowing down of the output voltage range of the differential amplifier circuit. Thus, it is possible to reduce the heat noise to prevent deterioration of the S/N ratio, while avoiding narrowing down of the output voltage range of the light-receiving amplifier.

Additional objects, features, and strengths of the present invention will be made clear by the description below. Further, the advantages of the present invention will be evident from the following explanation in reference to the drawings.

DESCRIPTION OF THE EMBODIMENTS

The present invention is described below with reference to the drawings.

Embodiment 1

Figure 1:
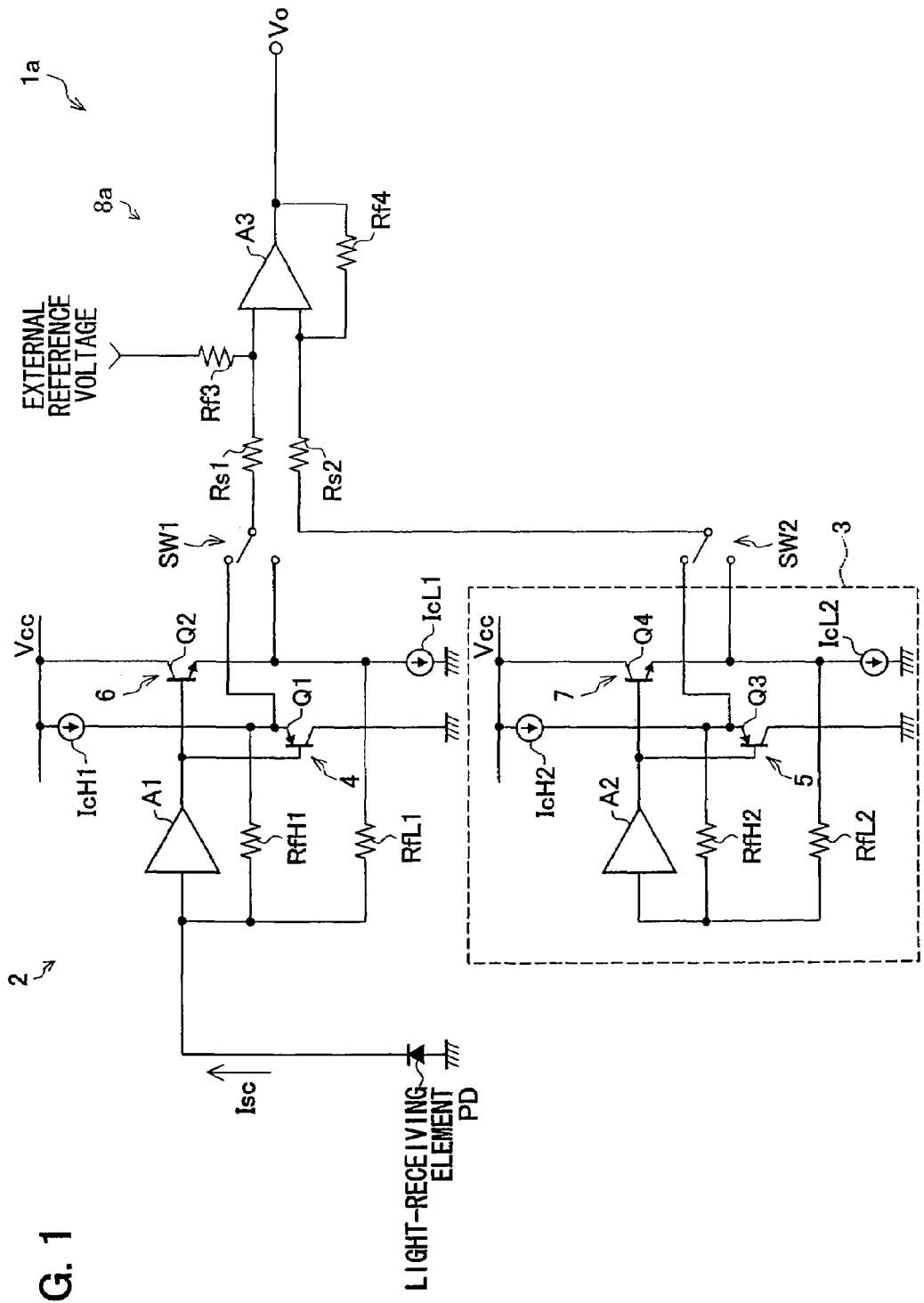
FIG. 1 is a circuit diagram illustrating a configuration of a light-receiving amplifier circuit of Embodiment 1, in accordance with the present invention.

FIG. 1 is a circuit diagram illustrating a configuration of a light-receiving amplifier circuit 1a of Embodiment 1. The light-receiving amplifier circuit 1a is provided with a preamplifier circuit 2 including an amplifier A1. To an input terminal of this amplifier A1 connected is one end of a light-receiving element PD whose another end is grounded. The amplifier A1 includes feedback resistors RfH1 and RfL1 for use in current-voltage conversion, each of which resistors provided so that feedback resistors RfH91 and RfL91 and the amplifier A91 are connected in parallel to one another. One end of each of the feedback resistors RfH1 and RfL1 is commonly connected to the input terminal of the amplifier A1.

The preamplifier circuit 2 is further provided with an emitter follower circuit (output voltage expanding circuit) 4 which includes a PNP transistor Q1 and a constant current source IcH1. The gate of the PNP transistor Q1 is connected to an output terminal of the amplifier A1. The collector of the PNP transistor Q1 is connected to (i) another end of the feedback resistor RfH1 and (ii) one end of the constant current source IcH1 whose another end is connected to a line through which a power source voltage Vcc is supplied. Furthermore, the emitter of the PNP transistor Q1 is grounded.

The preamplifier circuit 2 further includes an emitter follower circuit (output circuit) 6 which includes an NPN transistor Q2 and a constant current source IcL1. The gate of the NPN transistor Q2 is connected to the output terminal of the amplifier A1. The emitter of the NPN transistor Q2 is connected to (i) another end of the feedback resistor RfL1 and (ii) one end of the constant current source IcL1 whose another end is grounded.

The light-receiving amplifier circuit 1a is provided further with a preamplifier circuit 3 whose configuration is identical to that of the preamplifier 2. This preamplifier circuit 3 includes an amplifier A2 which is apart from the light-receiving element PD.

The amplifier A2 includes feedback resistors RfH2 and RfL2 which are provided so that feedback resistors RfH91 and RfL91 and the amplifier A91 are connected in parallel to one another. One end of each of the feedback resistors RfH2 and RfL2 is commonly connected to an input terminal of the amplifier A2.

The preamplifier circuit 3 is further provided with an emitter follower circuit 5 which includes a PNP transistor Q3 and a constant current source IcH2. The gate of the PNP transistor Q3 is connected to an output terminal of the amplifier A2. The collector of the PNP transistor Q3 is connected to (i) another end of the feedback resistor RfH2 and (ii) one end of the constant current source IcH2 whose another end is connected to a line through which the power source voltage Vcc is supplied. Furthermore, the emitter of the PNP transistor Q3 is grounded.

The preamplifier circuit 3 further includes an emitter follower circuit 7 which includes an NPN transistor Q4 and a constant current source IcL2. The gate of the NPN transistor Q4 is connected to the output terminal of the amplifier A2. The emitter of the NPN transistor Q4 is connected to (i) another end of the feedback resistor RfL2 and (ii) one end of the constant current source IcL2 whose another end is grounded.

The light-receiving amplifier circuit 1a is further provided with a differential amplifier circuit 8a which includes a differential amplifier (a first differential amplifier) A3. One of the input terminals (first input terminal) of the differential amplifier A3 is connected to a switch SW1 via a resistor Rs1. To a connection point between the first input terminal of the differential amplifier A3 and the resistor Rs1 connected via a resistor Rf3 is a terminal through which an external reference voltage is supplied. Another one of the input terminals (second input terminal) of the differential amplifier A3 is connected to a switch SW2 via a resistor Rs2. Between the second input terminal and an output terminal of the differential amplifier A3 provided is a feedback resistor Rf4. Further, the gain of the differential amplifier circuit 8a is set at less than 1.

The switch SW1 is for switching the connection of the first input terminal of the differential amplifier A3 to one of (i) a terminal between the PNP transistor Q1 and the feedback resistor RfH1, and (ii) a terminal between the NPN transistor Q2 and the feedback resistor RfL1. The switch SW2 is for switching the connection of the second input terminal of the differential amplifier A3 to (i) a terminal between the PNP transistor Q3 and the feedback resistor RfH2, or (ii) a terminal between the NPN transistor Q4 and the feedback resistor RfL2.

When the noise of the amplifier is a problem (e.g. when reading a RAM disc), the switch SW1 connects the first input terminal of the differential amplifier A3 to the terminal between the PNP transistor Q1 and the feedback resistor RfH1. Further, the switch SW2 connects the second input terminal of the differential amplifier A3 to the terminal between the PNP transistor Q3 the feedback resistor RfH2. On the contrary, when writing in data by using an extremely large amount of laser light, the switch SW1 connects the first input terminal of the differential amplifier A3 to the terminal between the NPN transistor Q2 and the feedback resistor RfL1. Further, the switch SW2 connects the second input terminal of the differential amplifier A3 to the terminal between the NPN transistor Q4 and the feedback resistor RfL2.

As described, the preamplifier circuit 2 has output circuits of different types: i.e. the emitter follower circuit 4 having the PNP transistor Q1 and the emitter follower circuit 6 having the NPN transistor Q2.

Figure 9:
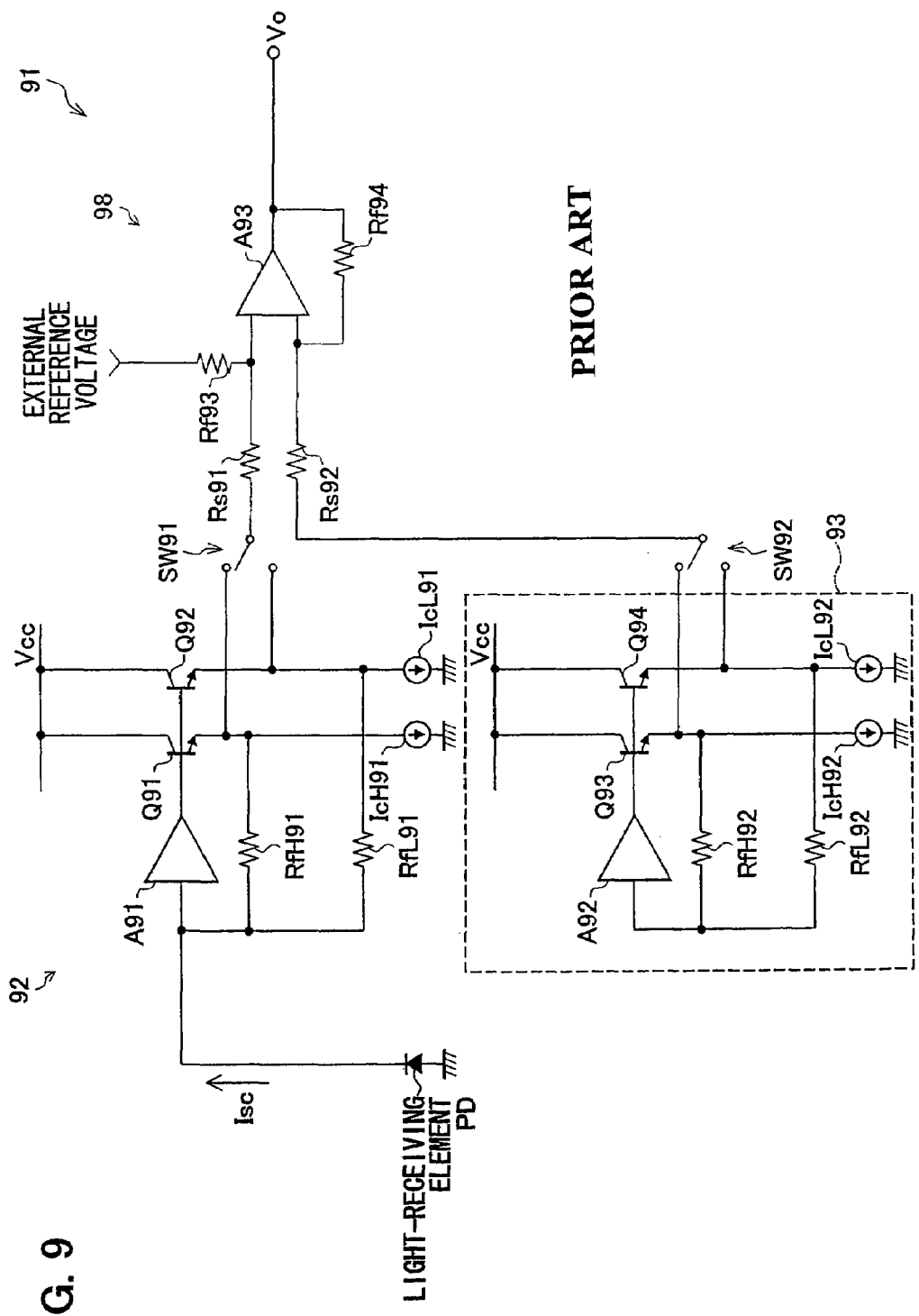
FIG. 9 is a circuit diagram illustrating a configuration of a light-receiving amplifier circuit provided in the conventional optical pickup device.

Here, as mentioned before, in the conventional light-receiving amplifier circuit 91 of FIG. 9, reducing the gain of the differential amplifier circuit 98 of the subsequent stage to less than 1, for the purpose of reducing heat noise causes, narrower output voltage range of the light-receiving amplifier circuit 91 than a case where the gain is 1 or more. This problem, however, is solved in the light-receiving amplifier circuit 1a.

The preamplifier circuit 2 of the light-receiving amplifier circuit 1a includes the output circuit (emitter follower circuit 6) having the NPN transistor Q2, and the output circuit (emitter follower circuit 4) having the PNP transistor Q1.

When the noise of amplifier is a problem (e.g. when reading a RAM disc), the switch SW1 connects the first input terminal of the differential amplifier A3 to the terminal between the PNP transistor Q1 and the feedback resistor RfH1, and the switch SW2 connects the second input terminal of the differential amplifier A3 to the terminal between the PNP transistor Q3 and the feedback resistor RfH2. Thus, a loop of the feedback resistor RfH1, PNP transistor Q1, and amplifier A1 is formed. By using this loop, it is possible to solve the problem of narrowing down the output voltage range of the light-receiving amplifier circuit.

Figure 2:
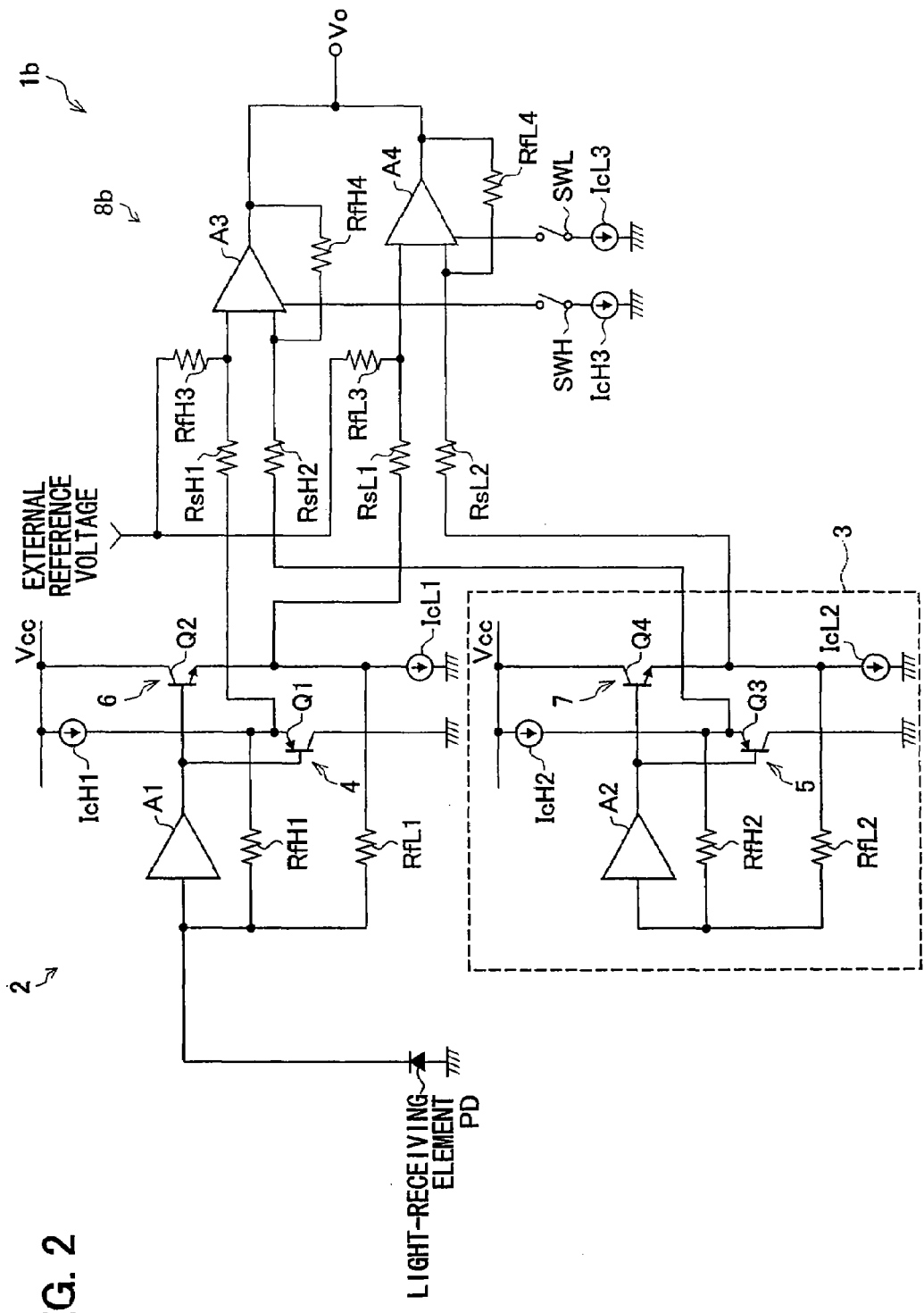
FIG. 2 is a circuit diagram illustrating a configuration of a light-receiving amplifier circuit of Embodiment 2, in accordance with the present invention.

Specifically, in the light-receiving amplifier circuit 91 of FIG. 9, the maximum output voltage of the preamplifier circuit 92 is:

Vcc−((Vbe of Q91 transistor)+(Maximum output voltage of Amplifier A91)), while the maximum output voltage at the loop of the feedback resistor RfH1 of the preamplifier circuit 2 illustrated in FIG. 2 is:

Vcc−(Saturation voltage of constant current source IcH1).

The constant current source IcH1 is configured by a current mirror circuit, and the saturation voltage of the constant current source IcH1 is the saturation voltage Vce of the transistor. As such, since Vbe>Vce, the following formula is given:

$$((Vbe \text{ of } Q91 \text{ transistor})+(\text{Maximum output voltage of Amplifier } A91)) > (\text{saturation voltage of constant current source } IcH1).$$

As a result, the maximum output voltage of the loop of the feedback resistor RfH1 of the preamplifier circuit 2 of FIG. 2 is larger than the maximum output voltage of the preamplifier circuit 92 of FIG. 9, and the output voltage range of the light-receiving amplifier circuit is expanded. This solves the problem of narrower output voltage range.

Further, in a case where the amount of laser light is extremely large (e.g. when writing in data), the use of the loop of the feedback resistor RfL1 in the preamplifier circuit 2 causes a flow of large current due to the extremely small resistance value of the feedback resistor RfL1.

In such a case, the capacity of the constant current source IcH1 needs to be increased, if the output circuit connected to the feedback resistor RfL1 is the emitter follower circuit 4 configured by PNP transistor Q1, which circuit used with the feedback resistor RfH1. This consequently causes an increase in both the circuit scale and the cost. The problem, however, is solved with the light-receiving amplifier circuit 1a of the present embodiment in which circuit the output circuit connected to the feedback resistor RfL1 is the emitter follower circuit 6 having the NPN transistor Q2.

Note that the present embodiment deals with a case where an output voltage expanding circuit is the emitter follower circuit 4 having the PNP transistor Q1. The present invention, however, is not limited to this, and is applicable to various configurations which allows expansion of the output voltage range of the amplifier A1.

Embodiment 2

FIG. 2 is a circuit diagram illustrating a configuration of a light-receiving amplifier circuit 1b of Embodiment 2. The same symbols are given to members which are identical to those of the foregoing configuration, and detailed explanation for these members are omitted. The same goes for the rest of the embodiments.

The light-receiving amplifier circuit 1b is provided with a differential amplifier circuit 8b which includes two differential amplifiers (first and second differential amplifiers) A3 and A4 connected in parallel to each other. One of the input terminals (first input terminal) of the differential amplifier A3 is connected, via a resistor RsH1, to a connection point between a PNP transistor Q1 and a constant current source IcH1 of a preamplifier circuit 2. Another one of the input terminals (second input terminal) of the differential amplifier A3 is connected, via a resistor RsH2, to a connection point between a PNP transistor Q3 and a constant current source IcH2 of a preamplifier circuit 3. To the first input terminal of the differential amplifier A3, an external reference voltage is supplied via a resistor RfH3. To the second input terminal and the output terminal of the differential amplifier A3 connected is a feedback resistor RfH4. Further, a constant current is supplied from a constant current source IcH3 to the differential amplifier A3. Between the constant current source IcH3 and the differential amplifier A3, a switch SWH is provided.

One of the input terminals (first input terminal) of the differential amplifier A4 is connected, via resistor RsL1, to a connection point between an NPN transistor Q2 and the constant current source IcL1 of the preamplifier circuit 2. Another one of the input terminals (second input terminal) of the differential amplifier A4 is connected, via a resistor RsL2, to a connection point between an NPN transistor Q4 of the preamplifier circuit 3 and a constant current source IcL2. To the first input terminal of the differential amplifier A4, an external reference voltage is supplied via a resistor RfL3. To the second input terminal and the output terminal of the differential amplifier A3 connected is a feedback resistor RfL4. Further, a constant current is supplied from the constant current source IcL3 to the differential amplifier A4. Between this constant current source IcL3 and the differential amplifier A4, a switch SWL is provided.

Here, the output circuit 6 connected to the feedback resistor RfL1 of the preamplifier circuit 2 is an emitter follower circuit 6 having an NPN transistor 6. As such, the output voltage range of the light-receiving amplifier circuit is narrowed as in the conventional circuit. However, the narrowing down of output voltage range of the light-receiving amplifier circuit 1b is prevented by providing, in parallel, plural differential amplifiers in the differential amplifier circuit 8b in the subsequent stage. Moreover, if the preamplifier circuit 2 uses the loop of feedback resistor RfL1, the narrowing down of output voltage range of the light-receiving amplifier circuit 1b is prevented by setting the gain of the differential amplifier A4 at 1 or more.

In a case where an amount of laser light is large (e.g. when writing in data), the signal of the amplifier is large as such. Accordingly, the noise is not a concern, and the gain of the differential amplifier circuit 8b can be set at 1 or more. In a case of reading a low-reflectance optical disc such as RAM disc, the noise of the amplifier is reduced by: (i) using the emitter follower circuit 4 having the PNP transistor Q1 as the output circuit connected to the feedback resistor RfH1 of the preamplifier circuit 2, which resistor has the highest resistance; and (ii) setting the gain of the differential amplifier A3 in the differential amplifier circuit 8b of the subsequent stage at less than 1. On the contrary, when writing in data or the like in which case the amount of laser light is large and a large current is needed, narrowing down of output voltage range of the light-receiving amplifier circuit 1b is prevented by: (i) using the emitter follower circuit 6 having the NPN transistor Q2 as the output circuit of the preamplifier circuit 2; and (ii) setting the gain of the differential amplifier circuit 8b of the subsequent stage at 1 or more. The present embodiment deals with an example where two gains (loops) are provided to the preamplifier circuit 2. However the present invention is not limited to this. By increasing the number of the loops, it is possible to set three or more gains for various laser light amounts for reading/writing information from/to various types of optical discs.

Embodiment 3

Figure 3:
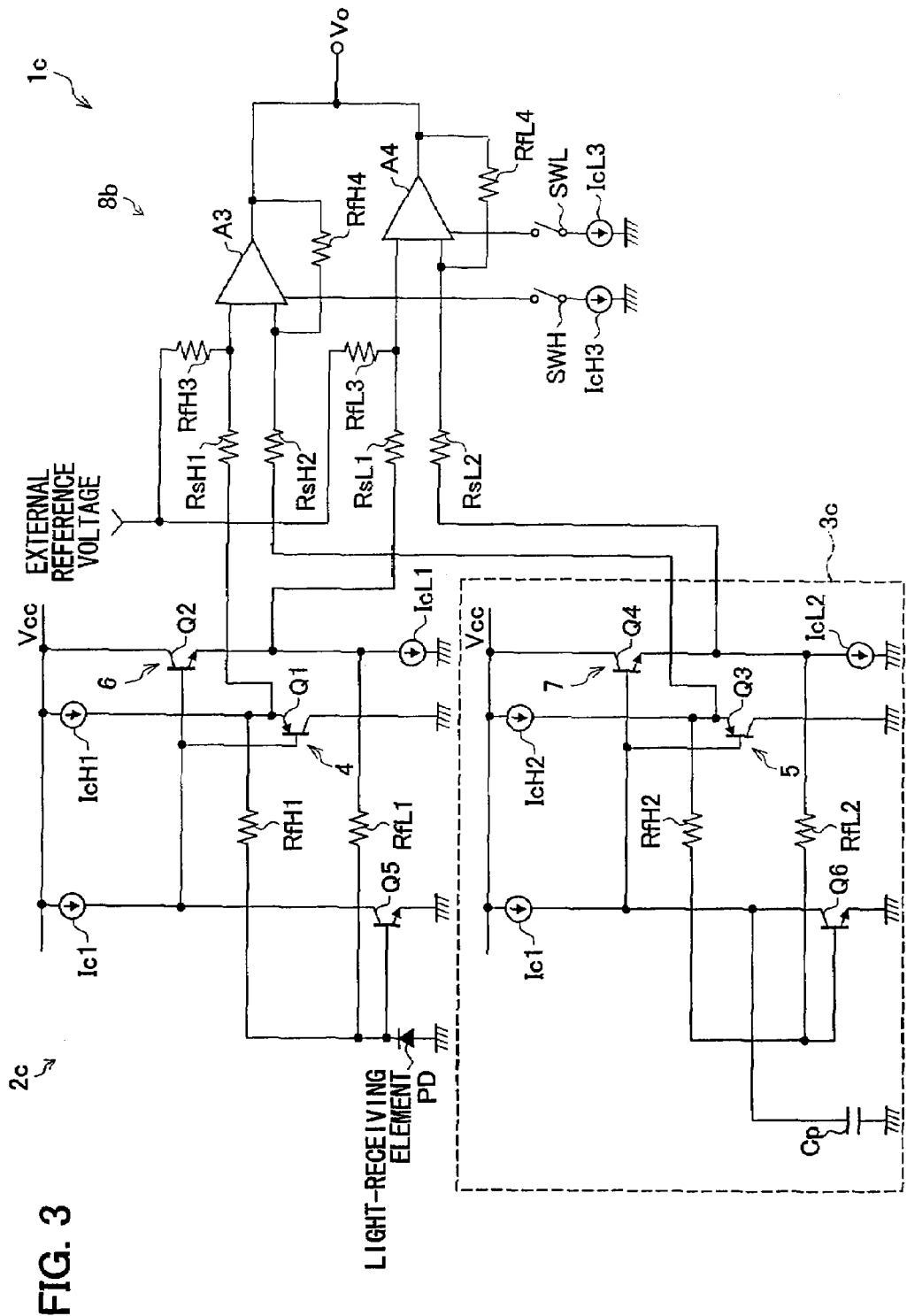
FIG. 3 is a circuit diagram illustrating a configuration of a light-receiving amplifier circuit of Embodiment 3, in accordance with the present invention.

FIG. 3 is a circuit diagram illustrating a configuration of a light-receiving amplifier circuit 1c of Embodiment 3. The light-receiving amplifier circuit 1c is an example where a grounded amplifier is used as an amplifier of a preamplifier circuit.

The light-receiving amplifier circuit 1c is provided with a preamplifier circuit 2c. The preamplifier circuit 2c has an NPN transistor Q5. The base of the NPN transistor Q5 is connected to: (i) a light-receiving element PD; (ii) one end of a feedback resistor RfH1; and (iii) one end of a feedback resistor RfL1. The collector of the NPN transistor Q5 is connected to: (i) the bases of a PNP transistor Q1 and an NPN transistor Q2; and (ii) one end of a constant current source Ic1 whose another end is connected to a line through which a power source voltage Vcc is supplied. The emitter of the NPN transistor Q5 is grounded.

The light-receiving amplifier circuit 1c further includes a preamplifier circuit 3c which includes an NPN transistor Q6. The base of the NPN transistor Q6 is connected to one end of a feedback resistor RfH2 and one end of a feedback resistor RfL2. The collector of the NPN transistor Q6 is connected to: (i) the bases of a PNP transistor Q3 and an NPN transistor Q4; and (ii) one end of a constant current source Ic1 whose another end is connected to a line through which the power source voltage Vcc is supplied. The emitter of the NPN transistor Q6 is grounded. To the collector of the NPN transistor Q6 connected is one end of the capacitor Cp whose another end is grounded.

An electric-current signal having been subject to a photoelectric conversion by the light-receiving element PD is input to the base of the NPN transistor Q5 in the input stage, and is subjected to current-amplification. Then, the resulting signal is output from the collector of the NPN transistor Q5. Here, the PNP transistor Q1 of the preamplifier circuit 2c, the feedback resistor RfH1, and the NPN transistor Q5 form a first loop. Further, the NPN transistor Q2, the feedback resistor RfL1, and the NPN transistor Q5 form a second loop.

The preamplifier circuit 3c has at all an identical configuration as that of the preamplifier circuit 2c, and is apart from the light-receiving element PD. In this preamplifier circuit 3c, heat noise is generated, as is the case of the preamplifier circuit 2c. However, noise of high-frequency side can be reduced by adding a capacitor Cp between the collector of the NPN transistor Q6 and a ground in the input stage of the preamplifier circuit 3c. Here, the wording "high-frequency side" refers to the high-frequency side of the frequency characteristics of the preamplifier circuit 3c. The noise of high-frequency side can be reduced by the frequency response characteristics determined by (i) the capacitor Cp and (ii) the output impedance of the NPN transistor Q6 in the input stage.

Embodiment 4

Figure 4:
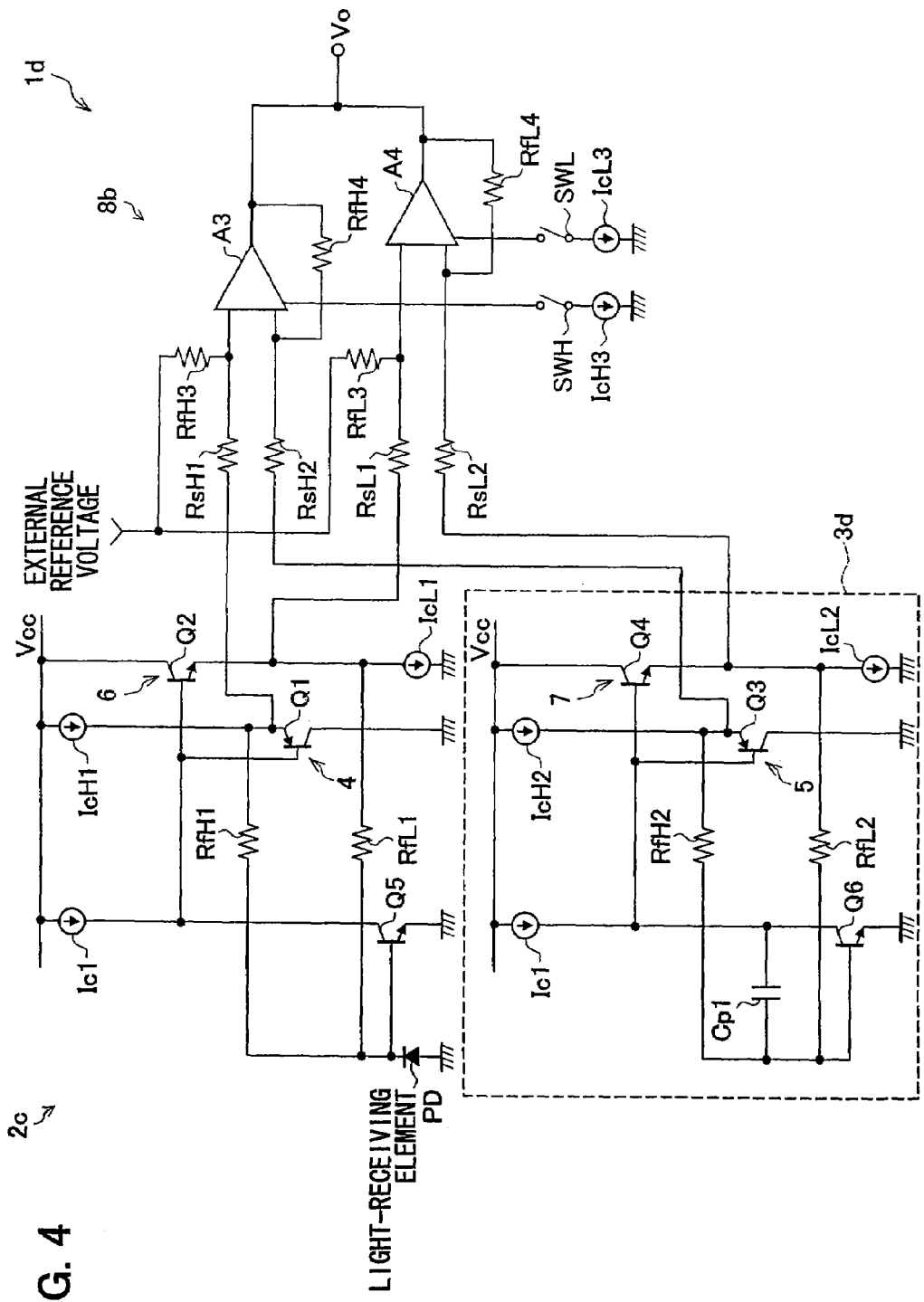
FIG. 4 is a circuit diagram illustrating a configuration of a light-receiving amplifier circuit of Embodiment 4, in accordance with the present invention.

FIG. 4 is a circuit diagram illustrating a configuration of a light-receiving amplifier circuit 1d of Embodiment 4. This light-receiving amplifier circuit 1d differs from the light-receiving amplifier circuit 1c of Embodiment 3 illustrated in FIG. 3, in that a capacitor Cp1 is provided, instead of the capacitor Cp, between the collector and base of the NPN transistor Q6 of the preamplifier circuit 3d. This configuration yields the same effect obtained from the configuration of Embodiment 3, with the use of the capacitor Cp1 whose capacitance is smaller than the capacitor Cp of the light-receiving amplifier circuit 1c illustrated in FIG. 3. Hence, reduction of the circuit scale and cost is possible.

Embodiment 5

Figure 5:
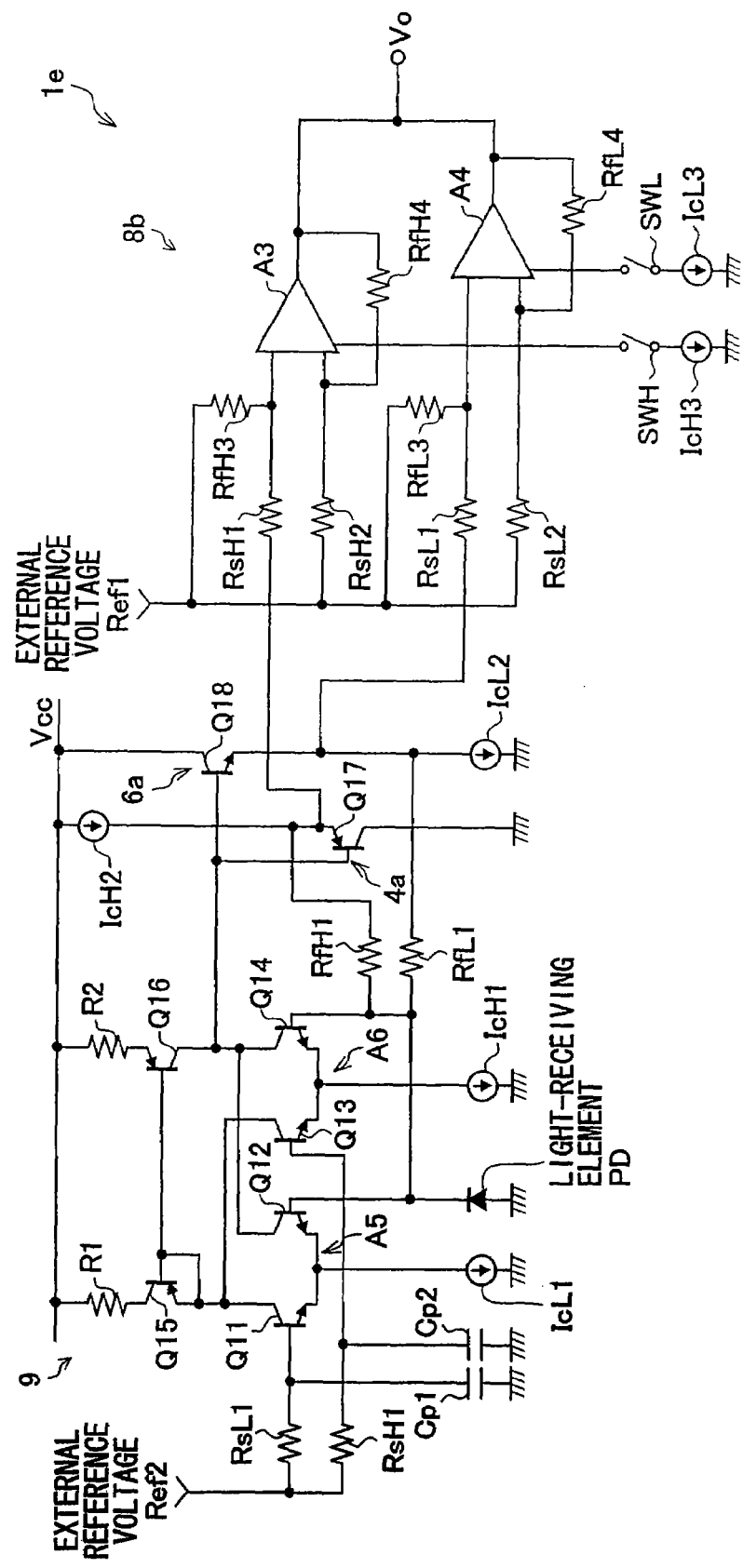
FIG. 5 is a circuit diagram illustrating a configuration of a light-receiving amplifier circuit of Embodiment 5, in accordance with the present invention.

FIG. 5 is a circuit diagram illustrating a configuration of a light-receiving amplifier circuit 1e of Embodiment 5. This light-receiving amplifier circuit 1e is an example in which a differential amplifier is used as a preamplifier. The light-receiving amplifier circuit 1e includes a pre-differential amplifier circuit 9.

The pre-differential amplifier circuit 9 includes a differential amplifier A6 which is provided with NPN transistors Q13 and Q14. The respective emitters of the NPN transistors Q13 and Q14 are commonly connected to one end of the constant current source IcH1 whose another end is grounded. The base of the NPN transistor Q14 is connected to: (i) one end of a feedback resistor RfH1; (ii) one end of a feedback resistor RfL1; and (ii) one end of a light-receiving element PD. The collector of the NPN transistor Q14 is connected to: (i) the base of a PNP transistor Q17 in an emitter follower circuit (output voltage expanding circuit) 4a; (ii) the base of an NPN transistor Q18 in an emitter follower circuit (output circuit) 6a; (iii) and the emitter of a PNP transistor Q16. To the base of the NPN transistor Q13, an external reference voltage Ref2 is supplied via a resistor RsH1. The collector of the NPN transistor Q13 is connected to the collector and base of the PNP transistor Q15.

The pre-differential amplifier circuit 9 further includes a differential amplifier A5. The differential amplifier A5 is provided with NPN transistors Q11 and Q12. The respective emitters of the NPN transistors Q11 and Q12 are commonly connected to one end of a constant current source IcL1 whose another end is grounded. The base of the NPN transistor Q12 is connected to: (i) one end of the feedback resistor RfH1; (ii) one end of the feedback resistor RfL1; and (iii) one end of the light-receiving element PD. The collector of the NPN transistor Q12 is connected to: (i) the base of the PNP transistor Q17 in the emitter follower circuit 4a; (ii) the base of the NPN transistor Q18 in the emitter follower circuit 6a; (iii) and the emitter of the PNP transistor Q16. To the base of an NPN transistor Q11, the external reference voltage Ref2 is supplied via a resistor RsL1. The collector of the NPN transistor Q11 is connected to the collector and the base of the PNP transistor Q15.

The base and collector of the PNP transistor Q15 are connected to each other, and the bases of the PNP transistors Q15 and Q16 are connected to each other. The emitter of the PNP transistor Q15 is connected, via a resistor R1, to a line through which a power source voltage Vcc is supplied. The collector of the PNP transistor Q16 is connected, via a resistor R2, to the line through which the power source voltage Vcc is supplied.

To a connection point between the base of the NPN transistor Q11 and the resistor RsL1 connected is one end of capacitor Cp1 whose another end is grounded. To a connection point between the base of the NPN transistor Q13 and a resistor RsH1 connected is one end of a capacitor Cp2 whose another end is grounded.

The collector of the PNP transistor Q17 in the emitter follower circuit 4a is connected to one end of the constant current source IcH2, and another end of the feedback resistor RfH1. Another end of the constant current source IcH2 is connected to the line through which the power source voltage Vcc is supplied. The emitter of the PNP transistor Q17 is grounded. The emitter of the NPN transistor Q18 in the emitter follower circuit 6a is connected to another end of the feedback resistor RfL1, and one end of the constant current source IcL2 whose another end is grounded.

As described, one end of the light-receiving element PD is connected to the base of the NPN transistor Q14 serving as a first input terminal of the differential amplifier, and another end of the light-receiving element PD is grounded. Further, between the input terminal and the output terminal of the differential amplifier (i.e. between the base and collector of the NPN transistor Q14) connected is the feedback resistor RfH1 which serves as the first resistor for converting photoelectric current from the light-receiving element PD into electric voltage. The external reference voltage Ref2 is supplied to the base of the NPN transistor Q13 (second input terminal) in the differential amplifier, via the resistor RsH1 (second resistor) which is equivalent to the first resistor, so as to generate the same voltage as an offset voltage occurring due to the current flowing through the base of NPN transistor Q14 (first input terminal) and the feedback resistor RfH1 (first resistor).

The light-receiving amplifier circuit 1e has the differential amplifier circuit 8b in the subsequent stage, for amplifying output voltage differential between the differential amplifier and the external reference voltage Ref2. In this light-receiving amplifier circuit 1e, the gain of the differential amplifier A3 in the differential amplifier circuit 8b is set at less than 1.

With this configuration, the circuit scale is made smaller than the foregoing ground amplifier configurations described with reference to FIGS. 3 and 4, and yet it is possible to reduce the heat noise while avoiding narrowing the output voltage range of the light-receiving amplifier circuit, as is the case of the ground amplifier configuration.

Further, the capacitor Cp2 is provided in such a manner that one end of the capacitor Cp2 is connected to a point between the NPN transistor Q13 and the resistor RsH1, and another end of the capacitor Cp2 is grounded. Further, the capacitor Cp1 is provided in such manner that one of its end is connected to a point between the NPN transistor Q11 and the resistor RsL1, and another end is grounded. The provision of these capacitors Cp1 and Cp2 allows reduction of high-frequency side noise in the differential amplifiers A5 and A6.

Embodiment 6

Figure 6:
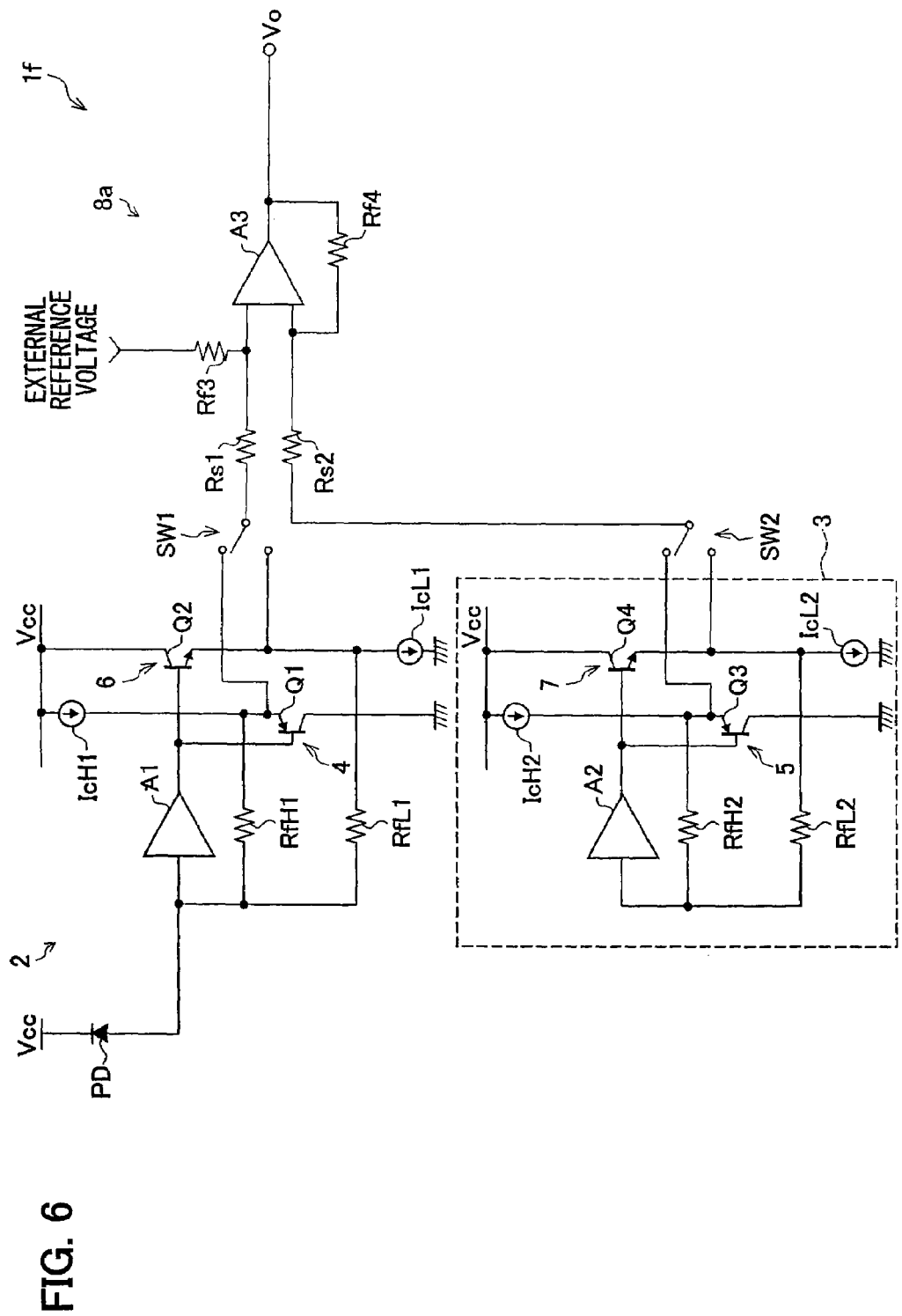
FIG. 6 is a circuit diagram illustrating a configuration of a light-receiving amplifier circuit of Embodiment 6, in accordance with the present invention.

FIG. 6 is a circuit diagram illustrating a configuration of a light-receiving amplifier circuit 1f of Embodiment 6. In the light-receiving amplifier circuit 1f, one end of light-receiving element PD is connected to a terminal through which a power source voltage is supplied.

The foregoing embodiments 1 to 5 deal with a light-receiving amplifier circuit which is formed on a P-type semiconductor substrate, and whose photo receiving element is connected to the ground potential (GND) and the input terminal of the preamplifier. In these cases, the output signal from the light-receiving amplifier circuit is positive in relation to an incoming optical signal.

On the contrary, the light-receiving amplifier circuit 1f of FIG. 6 is formed on an N-type semiconductor substrate, and the light-receiving element PD is connected to: (i) a terminal through which a power source voltage (Vcc) is supplied; and (ii) an input terminal of the preamplifier. In this case, the output signal from the light-receiving amplifier circuit is negative in relation to an incoming optical signal. Due to this negative output, the performance of this light-receiving amplifier circuit 1f is at all symmetrical to the performance of the case of the positive output.

For example, it is supposed that the light-receiving element PD in the light-receiving amplifier circuit 1b of FIG. 2 is connected to: (i) the terminal through which the power source voltage (Vcc) is supplied; and (ii) the input terminal of the preamplifier. In this example, the emitter follower circuit 6 having the NPN transistor Q2 to be connected to the feedback resistor RfL1 is used, when reading data. Further, the gain of the differential amplifier A4 of the differential amplifier circuit 8b in the subsequent stage is set at less than 1. On the contrary, in the same example, the emitter follower circuit 4 having the PNP transistor Q1 to be connected to the feedback resistor RfH1 is used when writing in data, and the gain of the differential amplifier A3 is set at 1 or more. This allows reduction of noise while avoiding narrowing down of the output voltage range of the light-receiving amplifier circuit.

Embodiment 7

Figure 7:
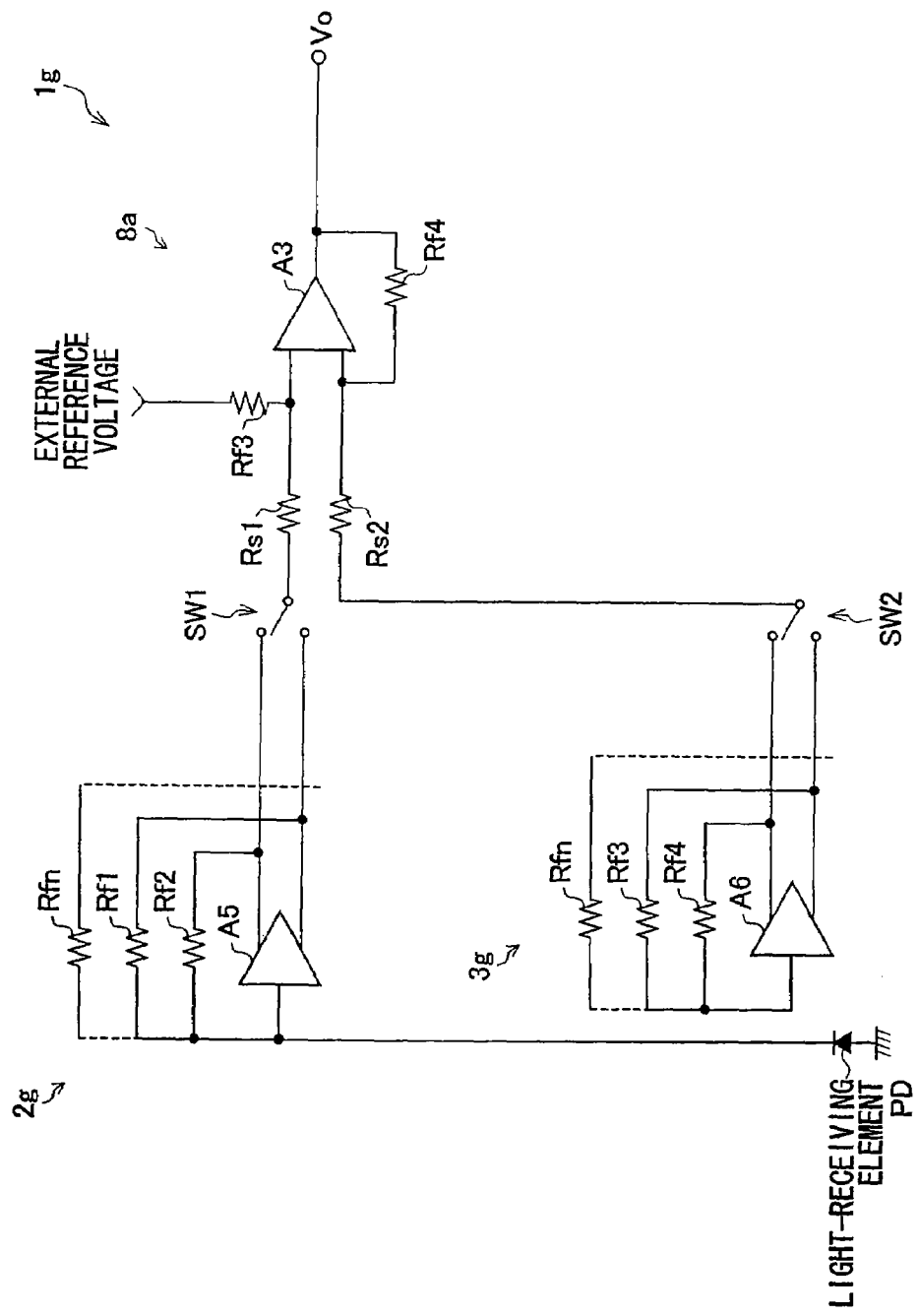
FIG. 7 is a circuit diagram illustrating a configuration of a light-receiving amplifier circuit of Embodiment 7, in accordance with the present invention.
Figure 8:
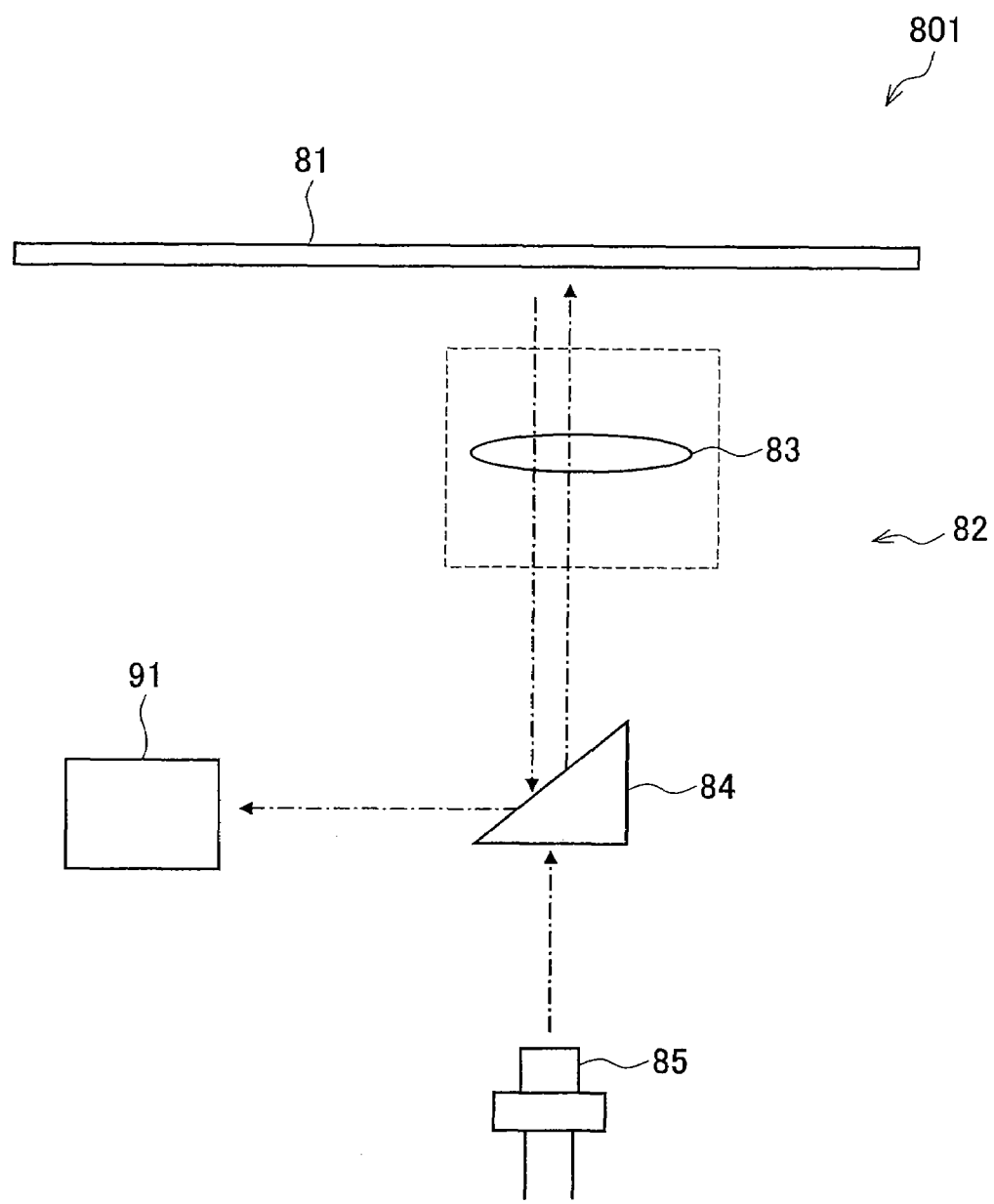
FIG. 8 is a block diagram illustrating a main configuration of a conventional optical pickup device.

FIG. 7 is a circuit diagram illustrating a configuration of a light-receiving amplifier circuit 1g of Embodiment 7. This light-receiving amplifier circuit 1g includes a preamplifier circuit 2g having an amplifier A5. To an input terminal of the amplifier A5 connected is a light-receiving element PD. A feedback resistor Rf1 is provided between one of the output terminals (first output terminal) and the input terminal of the amplifier A5. Further, a feedback resistor Rf2 is provided between another one of the output terminals (second output terminal) and the input terminal of the amplifier A5.

The light-receiving amplifier circuit 1g further includes a preamplifier circuit 3g. The preamplifier circuit 3g has the same configuration as that of the preamplifier circuit 2g, and is apart from the light-receiving element PD. This preamplifier circuit 3g includes an amplifier A6. Further, a feedback resistor Rf3 is provided between one of output terminals (first output terminal) and an input terminal of the amplifier A6. A feedback resistor Rf4 is provided between another one of the output terminals (second output terminal) and the input terminal of the amplifier A6.

A switch SW1 connects the first input terminal of the differential amplifier A3 to one of the two output terminals of the amplifier A5. A switch SW2 connects the second input terminal of the differential amplifier A3 to one of the two output terminals of the amplifier A6.

As mentioned before, when reading a low-reflectance disc such as a RAM disc, the light-receiving amplifier circuit needs to be extremely sensitive, and the gain resistor (Rf1×Rf4/Rs2) of the light-receiving amplifier circuit needs to be large as such. The increase of the resistance value, however, causes an increase of noise in the poetical receiver circuit itself, which consequently causes extremely poor S/N ratio of the output signal Vo of the light-receiving amplifier circuit. The noise of the light-receiving amplifier circuit itself is mostly heat noise, and is expressed by:

$$\{4k(Rf1)T(\Delta f)\}^{1/2} \times Rf4/Rs2\}.$$

In order to reduce such heat noise of the light-receiving amplifier circuit, it is necessary to reduce the feedback resistor RfH1 of the preamplifier circuit 2g, or to reduce the gain (Rf4/Rs2) of the differential amplifier circuit 8a in the subsequent stage. As is indicated by the above formula, the heat noise is proportional to the square root of the feedback resistor RfH1 of the preamplifier circuit 2g. However, the gain (Rf4/Rs2) of the differential amplifier circuit 8a in the subsequent stage multiplies the heat noise by (Rf4/Rs2). Accordingly, it is more effective to reduce the heat noise by setting the gain (Rf4/Rs2) at less than 1. In the present embodiment, the heat noise is reduced by setting the gain (Rf4/Rs2) of the differential amplifier circuit 8a at less than 1.

As described, A light-receiving amplifier circuit of the present invention includes: a first preamplifier circuit of voltage-parallel-feedback type, to which circuit a light-receiving element is connected; a second preamplifier circuit which is the same type as the first preamplifier circuit and which is apart from the light-receiving element; and a differential amplifier circuit for amplifying output voltage differential between the first and second preamplifier circuits, wherein each of the first and second preamplifier circuits includes an amplifier and plural feedback resistors provided in parallel to the amplifier, each of which resistors has an end commonly connected to an input terminal of the amplifier; an amplification factor of the differential amplifier circuit is less than one; and the first preamplifier circuit includes an output voltage expanding circuit which is (A) connected to (i) another end of at least one of the feedback resistors in the first preamplifier circuit and (ii) an output terminal of the amplifier, and (B) for expanding an output voltage range from the amplifier and supplying the expanded output voltage range to the differential amplifier circuit.

In the configuration, the first preamplifier is provided with the output voltage expanding circuit for supplying the output voltage range from the amplifier to the differential amplifier circuit. This output voltage expanding circuit is connected to (i) the other end of at least one of plural feedback resistors in the first preamplifier and (ii) the output terminal of the amplifier. This configuration allows expansion of output voltage range to be supplied from the amplifier of the first preamplifier to the differential amplifier circuit. Accordingly, setting of the amplification factor of the differential amplifier circuit at less than 1, for the purpose of reducing heat noise in the light-receiving amplifier circuit, does not cause narrowing down of the output voltage range of the differential amplifier circuit. Thus, it is possible to reduce the heat noise to prevent deterioration of the S/N ratio, while avoiding narrowing down of the output voltage range of the light-receiving amplifier.

The light-receiving amplifier circuit of the present invention may be adapted so that the output voltage expanding circuit further includes an emitter follower circuit configured by a PNP transistor.

The above configuration allows expansion of the output voltage range to be supplied to from the amplifier of the first preamplifier to the differential amplifier circuit, with a use of a simple configuration.

The light-receiving amplifier circuit of the present invention may be adapted so that the first preamplifier circuit further includes an output circuit for supplying an output voltage from the amplifier to the differential amplifier circuit, the output circuit being connected to (i) another end of each of the feedback resistors in the first preamplifier circuit and (ii) the output terminal of the amplifier.

In the above configuration, it is possible to switchover the output voltage to be supplied to the differential amplifier between output from the output voltage expanding circuit and the output from the output circuit. Namely, when reading information recorded on a low-reflectance disc such as a RAM disc, the output voltage is supplied to the differential amplifier circuit from the output voltage expanding circuit, while the output voltage is supplied from the output circuit to the differential amplifier circuit, when reading or writing information from/to a typical optical disc. As such, the gain of the first preamplifier can be switched depending on the occasions (i.e. reading information or writing information), and on the reflectance of the optical disc.

The light-receiving amplifier circuit of the present invention may be adapted so that the output circuit includes an emitter follower circuit configured by an NPN transistor.

The above configuration allows realization of an output circuit, with a simple configuration, for supplying the output voltage from the amplifier to the differential amplifier circuit.

The light-receiving amplifier circuit of the present invention may be adapted so that: the second preamplifier circuit is also provided with an output voltage expanding circuit and an output circuit; the differential amplifier circuit includes: (A) a first differential amplifier connected to (i) the output voltage expanding circuit provided in the first preamplifier circuit and (ii) the output voltage expanding circuit provided in the second preamplifier circuit; and (B) a second differential amplifier connected to (i) the output circuit provided in the first preamplifier circuit and (ii) the output circuit provided in the second preamplifier circuit; an amplification factor of the first differential amplifier is less than 1; and an amplification factor of the second differential amplifier is 1 or more.

The above configuration allows switching over of route between (i) a route of the output circuit in the first preamplifier circuit and the second differential amplifier, and (ii) a route of output voltage expanding circuit and the first differential amplifier, depending on whether an amount of laser light is large (e.g. when writing data in an optical disc) or small (e.g. when reading data from an optical disc).

When an amount of laser light is extremely large, a large current flows in the feedback resistor connected to the output circuit. In this case, preventing an increase in the circuit scale by configuring the output circuit with a use of an emitter follower circuit having an NPN transistor causes narrowing down of the output voltage range of the first preamplifier circuit. This narrowing down of the output voltage range, however, is prevented by increasing the amplification factor of the second differential amplifier to 1 or more.

The light-receiving amplifier circuit of the present invention may be adapted so that at least one of the plural feedback resistors in the first preamplifier circuit has larger resistance than the rest of the plural feedback resistors.

In the above configuration, a small current in the case where a laser light amount is small (e.g. when reading an optical disc) is amplified by a large gain.

The light-receiving amplifier circuit of the present invention may be adapted so that the amplifier provided in the second preamplifier circuit is configured by a transistor, and a capacitor is provided between the collector of the transistor and a ground.

The above configuration allows reduction of high-frequency side noise.

The light-receiving amplifier circuit of the present invention may be adapted so that the amplifier in the second preamplifier circuit is configured by a transistor, and a capacitor is provided between the collector and base of the transistor.

The above configuration yields the same effect, with a use of smaller capacitor, which effect obtained by a configuration in which the capacitor is provided between the collector of the transistor and a ground. This contributes to reduction of the circuit scale and the cost.

The light-receiving amplifier circuit of the present invention may be adapted so that: the first and second preamplifier circuits and the differential amplifier circuit are formed on a single P-type semiconductor substrate; the light-receiving element is connected to a ground and the first preamplifier circuit; the output voltage expanding circuit includes an emitter follower circuit configured by a PNP transistor.

The above configuration realizes a light-receiving amplifier circuit which performs positive output in relation to an incoming optical signal.

The light-receiving amplifier circuit of the present invention may be adapted so that: the first and second preamplifier circuits and the differential amplifier circuit are formed on a single N-type semiconductor substrate; the photo receiving element is connected to a terminal to which a power source voltage is applied and the first preamplifier circuit; the output voltage expanding circuit includes an emitter follower circuit configured by an NPN transistor.

The above configuration realizes a light-receiving amplifier circuit which performs negative output in relation to an incoming optical signal.

Further, a light-receiving amplifier circuit of the present invention includes: a pre-differential amplifier circuit of voltage-parallel-feedback type, to which circuit a light-receiving element is connected; a differential amplifier circuit for amplifying differential between an output voltage from the pre-differential amplifier circuit and a first reference voltage; and an output voltage expanding circuit, wherein: the pre-differential amplifier circuit includes a differential amplifier and plural feedback resistors provided in parallel to the differential amplifier, each of which resistors has an end connected to one of input terminals of the differential amplifier; an amplification factor of the differential amplifier circuit is less than 1; and the output voltage expanding circuit is for (i) expanding an output voltage range from the differential amplifier and (ii) supplying the expanded output voltage range to the differential amplifier circuit, and is connected to another end of at least one of the plural feedback resistors and an output terminal of the differential amplifier.

The above configuration is provided with the output voltage expanding circuit for expanding the output voltage range from the differential amplifier and for supplying the expanded output voltage range to the differential amplifier circuit. This output voltage expanding circuit is connected to the other end of at least one of the plural feedback resistors and the output terminal of the differential amplifier. This configuration allows expansion of output voltage range to be supplied from the differential amplifier of the pre-differential amplifier to the differential amplifier circuit. Accordingly, setting of the amplification factor of the differential amplifier circuit at less than 1, for the purpose of reducing heat noise in the light-receiving amplifier circuit, does not cause narrowing down of the output voltage range of the differential amplifier circuit. Thus, it is possible to reduce the heat noise to prevent deterioration of the S/N ratio, while avoiding narrowing down of the output voltage range of the light-receiving amplifier.

The light-receiving amplifier circuit of the present invention may be adapted so that: the differential amplifier includes another input terminal for receiving a second reference voltage via a resistor; and to a connection point between the another input terminal of the differential amplifier and the resistor, an end of a capacitor whose another end is grounded is connected.

The above configuration allows reduction of high-frequency side noise of the differential amplifier with the use of the capacitor.

The light-receiving amplifier circuit of the present invention may be adapted so that: the pre-differential amplifier circuit and the differential amplifier circuit are formed on a single P-type semiconductor substrate; the light-receiving element is connected to a ground and the pre-differential amplifier circuit; the output voltage expanding circuit includes an emitter follower circuit configured by a PNP transistor.

The above configuration realizes a light-receiving amplifier circuit which performs positive output in relation to an incoming optical signal.

The light-receiving amplifier circuit of the present invention may be adapted so that: the pre-differential amplifier circuit and the differential amplifier circuit are formed on a single N-type semiconductor substrate; the photo receiving element is connected to a terminal to which a power source voltage is applied, and to the first pre-differential amplifier circuit; and the output voltage expanding circuit includes an emitter follower circuit configured by an NPN transistor.

The above configuration realizes a light-receiving amplifier circuit which performs negative output in relation to an incoming optical signal.

Further, an optical pickup device of the present invention includes: a semiconductor laser element for emitting laser light; and the light-receiving amplifier circuit as set forth in claim 1, for performing photoelectric conversion and amplification with respect to laser light emitted from the semiconductor laser element, which light has been reflected off an optical disc.

In the above configuration, the light-receiving amplifier circuit is provided with the output voltage expanding circuit for expanding the output voltage range from the differential amplifier and for supplying the expanded output voltage range to the differential amplifier circuit. This output voltage expanding circuit is connected to the other end of at least one of the plural feedback resistors and the output terminal of the differential amplifier. This configuration allows expansion of output voltage range to be supplied from the differential amplifier of the pre-differential amplifier to the differential amplifier circuit. Accordingly, setting of the amplification factor of the differential amplifier circuit at less than 1, for the purpose of reducing heat noise in the light-receiving amplifier circuit, does not cause narrowing down of the output voltage range of the differential amplifier circuit. Thus, it is possible to reduce the heat noise to prevent deterioration of the S/N ratio, while avoiding narrowing down of the output voltage range of the light-receiving amplifier.

The optical pickup device of the present invention may be adapted so that: the optical disc encompasses a low-reflectance optical disc, and when performing the photoelectric conversion and amplification with respect to laser light reflected off the low-reflectance optical disc, an output voltage of the output voltage expanding circuit connected to the at least one of plural feedback resistors is supplied to the differential amplifier circuit.

In the above configuration, when the laser light reflected off the low-reflectance optical disc is subjected to the photoelectric conversion, and amplification at a large gain with the use of resistor whose resistance is increased, the heat noise is reduced to prevent deterioration of the S/N ratio, while avoiding narrowing down of the output voltage range of the light-receiving amplifier circuit.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A light-receiving amplifier circuit comprising:
   a pre-differential amplifier circuit of voltage-parallel-feedback type, to which circuit a light-receiving element is connected;
   a differential amplifier circuit for amplifying differential between an output voltage from said pre-differential amplifier circuit and a first reference voltage;
   and an output voltage expanding circuit, wherein
   said pre-differential amplifier circuit includes a differential amplifier and plural feedback resistors provided in parallel to said differential amplifier, each of which resistors has an end connected to one of input terminals of said differential amplifier;
   an amplification factor of said differential amplifier circuit is less than 1; and
   said output voltage expanding circuit is for (i) expanding an output voltage range from said differential amplifier and (ii) supplying the expanded output voltage range to the differential amplifier circuit, and is connected to another end of at least one of said plural feedback resistors and an output terminal of said differential amplifier.

2. A light-receiving amplifier circuit as set forth in claim 1, wherein
   said differential amplifier includes another input terminal for receiving a second reference voltage via a resistor; and
   to a connection point between said another input terminal of the differential amplifier and said resistor, an end of a capacitor whose another end is grounded is connected.

3. The light-receiving amplifier circuit as set forth in claim 1, wherein
   said pre-differential amplifier circuit and said differential amplifier circuit are formed on a single P-type semiconductor substrate;
   said light-receiving element is connected to a ground and said pre-differential amplifier circuit;
   said output voltage expanding circuit includes an emitter follower circuit configured by a PNP transistor.

4. The light-receiving amplifier circuit as set forth in claim 1, wherein
   said differential amplifier circuit and said differential amplifier circuit are formed on a single N-type semiconductor substrate;
   said photo receiving element is connected to a terminal to which a power source voltage is applied, and to said first pre-differential amplifier circuit; and
   said output voltage expanding circuit includes an emitter follower circuit configured by an NPN transistor.

5. A light-receiving amplifier circuit, comprising:
   a first preamplifier circuit of voltage-parallel-feedback type, to which circuit a light-receiving element is connected;
   a second preamplifier circuit which is the same type as said first preamplifier circuit and which is apart from said light-receiving element; and
   a differential amplifier circuit for amplifying output voltage differential between said first and second preamplifier circuits, wherein
   each of said first and second preamplifier circuits includes an amplifier and plural feedback resistors provided in parallel to the amplifier, each of which resistors has an end commonly connected to an input terminal of said amplifier;
   an amplification factor of said differential amplifier circuit is less than one; and said first preamplifier circuit includes an output voltage expanding circuit which is (A) connected to (i) another end of at least one of said feedback resistors in said first preamplifier circuit and (ii) an output terminal of said amplifier, and (B) for expanding an output voltage range from said amplifier and supplying the expanded output voltage range to the differential amplifier circuit.

6. The photo receiving amplifier circuit as set forth in claim 5, wherein
said output voltage expanding circuit further includes an emitter follower circuit configured by a PNP transistor.

7. The light-receiving amplifier circuit as set forth in claim 5, wherein
said first preamplifier circuit further includes an output circuit for supplying an output voltage from the amplifier to said differential amplifier circuit, said output circuit being connected to (i) another end of each of said feedback resistors in said first preamplifier circuit and (ii) the output terminal of said amplifier.

8. The photo receiving amplifier circuit as set forth in claim 7, wherein
said output circuit includes an emitter follower circuit configured by an NPN transistor.

9. A light-receiving amplifier circuit as set forth in claim 7, wherein
said second preamplifier circuit is also provided with an output voltage expanding circuit and an output circuit;
said differential amplifier circuit includes: (A) a first differential amplifier connected to (i) said output voltage expanding circuit provided in the first preamplifier circuit and (ii) said output voltage expanding circuit provided in said second preamplifier circuit; and (B) a second differential amplifier connected to (i) the output circuit provided in the first preamplifier circuit and (ii) the output circuit provided in the second preamplifier circuit;
an amplification factor of said first differential amplifier is less than 1; and
an amplification factor of said second differential amplifier is 1 or more.

10. A light-receiving amplifier circuit as set forth in claim 7, wherein
at least one of said plural feedback resistors in the first preamplifier circuit has larger resistance than the rest of said plural feedback resistors.

11. The light-receiving amplifier circuit as set forth in claim 5, wherein
said amplifier provided in the second preamplifier circuit is configured by a transistor, and
a capacitor is provided between the collector and ground of said transistor.

12. The light-receiving amplifier circuit as set forth in claim 5, wherein
said amplifier in the second preamplifier circuit is configured by a transistor, and
a capacitor is provided between the collector and base of said transistor.

13. The photo receiving amplifier circuit as set forth in claim 5, wherein
said first and second preamplifier circuits and said differential amplifier circuit are formed on a single P-type semiconductor substrate;
said light-receiving element is connected to a ground and said first preamplifier circuit;
said output voltage expanding circuit includes an emitter follower circuit configured by a PNP transistor.

14. A light-receiving amplifier circuit as set forth in claim 5, wherein
said first and second preamplifier circuits and said differential amplifier circuit are formed on a single N-type semiconductor substrate;
said photo receiving element is connected to a terminal to which a power source voltage is applied and said first preamplifier circuit;
said output voltage expanding circuit includes an emitter follower circuit configured by an NPN transistor.

15. An optical pickup device comprising:
a semiconductor laser element for emitting laser light; and
said light-receiving amplifier circuit as set forth in claim 5, for performing photoelectric conversion and amplification with respect to laser light emitted from said semiconductor laser element, which light has been reflected off an optical disc, wherein
said light-receiving amplifier circuit includes:
a first preamplifier circuit of voltage-parallel-feedback type, to which circuit a light-receiving element is connected;
a second preamplifier circuit which is the same type as said first preamplifier circuit and which is apart from said light-receiving element; and
a differential amplifier circuit for amplifying output voltage differential between said first and second preamplifier circuits,
each of said first and second preamplifier circuits including an amplifier and plural feedback resistors provided in parallel to the amplifier, each of which resistors has an end commonly connected to an input terminal of said amplifier,
an amplification factor of said differential amplifier circuit being less than one, and
said first preamplifier circuit including an output voltage expanding circuit which is (A) connected to (i) another end of at least one of said feedback resistors in said first preamplifier circuit and (ii) an output terminal of said amplifier, and (B) for expanding an output voltage range from said amplifier and supplying the expanded output voltage range to the differential amplifier circuit.

16. The optical pickup device as set forth in claim 15, wherein
said optical disc encompasses a low-reflectance optical disc, and
when performing the photoelectric conversion and amplification with respect to laser light reflected off said low-reflectance optical disc, an output voltage of said output voltage expanding circuit connected to said at least one of plural feedback resistors is supplied to said differential amplifier circuit.

* * * * *